United States Patent [19]

Kashiwagi et al.

[11] Patent Number: 4,500,383
[45] Date of Patent: Feb. 19, 1985

[54] PROCESS FOR BONDING COPPER OR COPPER-CHROMIUM ALLOY TO CERAMICS, AND BONDED ARTICLES OF CERAMICS AND COPPER OR COPPER-CHROMIUM ALLOY

[75] Inventors: Yoshiyuki Kashiwagi; Tsutai Suzuki, both of Shinagawa, Japan

[73] Assignee: Kabushiki Kaisha Meidensha, Tokyo, Japan

[21] Appl. No.: 465,043

[22] Filed: Feb. 8, 1983

[30] Foreign Application Priority Data

Feb. 18, 1982 [JP] Japan .................................. 57-24758
Mar. 4, 1982 [JP] Japan .................................. 57-34247

[51] Int. Cl.$^3$ ............................................ B29C 17/00
[52] U.S. Cl. ..................................... 156/285; 156/286; 156/305; 156/306.6; 156/325; 228/124; 427/126.2; 427/126.3; 427/404; 428/432; 428/472; 428/621; 428/630; 428/699
[58] Field of Search ............ 156/285, 325, 286, 306.6, 156/305; 427/126.2, 126.3, 404; 428/432, 699, 472, 621, 630; 228/124

[56] References Cited

U.S. PATENT DOCUMENTS

| | | | |
|---|---|---|---|
| 2,130,879 | 9/1938 | Dobke ................................ | 156/305 |
| 3,296,017 | 1/1967 | Rubin . | |
| 3,360,349 | 12/1967 | Adomines ......................... | 428/630 |
| 3,390,969 | 7/1968 | Sullivan et al. ................... | 428/472 |
| 3,676,292 | 7/1972 | Pryor et al. ........................ | 156/325 |
| 4,364,995 | 12/1982 | Crawford et al. ................. | 428/702 |

FOREIGN PATENT DOCUMENTS

| | | | |
|---|---|---|---|
| 39611 | 11/1981 | European Pat. Off. . | |
| 832251 | 4/1960 | United Kingdom ............... | 228/124 |
| 1051393 | 8/1965 | United Kingdom . | |
| 2059323 | 10/1979 | United Kingdom . | |

*Primary Examiner*—John J. Gallagher
*Attorney, Agent, or Firm*—Schwartz, Jeffery, Schwaab, Mack, Blumenthal & Koch

[57] ABSTRACT

A process for bonding a copper or copper-chromium alloy body and a ceramic body of components of an electrical or electronic device to each other includes a step of directly sandwiching a layer of chromium oxide between the ceramic and copper or copper-chromium bodies, a step of heating a temporary assembly of the ceramic and copper or copper-chromium alloy bodies and the layer of chromium oxide, under an atmosphere which can oxidize chromium without oxidizing copper, at a temperature of at least 900° C. but below the melting point of copper or the alloy, and then a step of slowly cooling the resulting bonded assembly. In particular, in a process for bonding the alloy body to the ceramic body, the chromium oxide sandwiching step is performed concurrently with the temporary assembly heating step. The bonding process can produce a hermetic envelope, particularly a vacuum envelope of a vacuum interrupter. The process for bonding the copper or alloy body to the ceramic body of this invention is more advantageous than bonding processes employing the so-called Telefunken method, in terms of cost and steps.

13 Claims, 7 Drawing Figures

4μ

4μ

4μ

4μ

4μ

PROCESS FOR BONDING COPPER OR COPPER-CHROMIUM ALLOY TO CERAMICS, AND BONDED ARTICLES OF CERAMICS AND COPPER OR COPPER-CHROMIUM ALLOY

BACKGROUND OF THE INVENTION

The present invention relates to a process for bonding a body of copper or a copper-chromium alloy to a body of ceramics, and to bonded articles of bodies of ceramics and copper or a copper-chromium alloy.

Heretofore, stout bonding of a copper body to a body of ceramics, e.g., alumina ceramics, especially such stout bonding as is required in a pressure or vacuum envelope, has been performed in accordance with the following process employing the so-called Telefunken method.

First, applied to surfaces to be bonded of alumina ceramics is a metallizing paste, a major component of which is a powdered refractory metal such as Mo or W, which is similar to alumina in coefficient of thermal expansion and sintering properties. Second, the applied layer of the metallizing paste is sintered in an atmosphere of humidified hydrogen gas at near the softening point of alumina, i.e. 1300° C. to 1500° C., to form a compact metallized layer stoutly bonded to the body of the alumina ceramics. Third, the metallized layer is plated with nickel or gold in order to improve the wetability between the outer layer and a molten brazing material. Finally, the copper and ceramic bodies are heated together at a temperature at which the solid brazing material trapped between the surfaces bond with both, and then are slowly cooled, the copper body and the ceramic body thus being bonded stoutly together.

This process for bonding a copper body to alumina ceramics entails some disadvantages as follows:

(1) An expensive metal such as Mo or W must be employed;

(2) The number of process steps is relatively high as an independent metallizing process in which a metal such as Mo or W is employed must be included in the bonding process;

(3) In the metallizing process, a completely sintered alumina ceramic is reheated to a temperature near the softening point of alumina; and (4) Brazing material must be employed.

In conclusion, the known process for bonding a copper body to alumina ceramics entails such disadvantages as high cost, many difficult-to-control factors and a long process execution time.

SUMMARY OF THE INVENTION

A primary object of the present invention is to provide a process for bonding a copper body to a body of ceramics which produces an assembly of stoutly bonded ceramic and copper bodies, at a low cost, with relatively few process steps and relatively quick process execution. The process is performed by heating ceramic and copper bodies sandwiching a chromium oxide layer in an atmosphere which will not oxidize copper at a temperature below the melting point of copper with chromium oxide sandwiched between the two bodies.

Another object of the present invention is to provide a modified process for bonding a copper body to ceramics which is as advantageous as the above process. The modified process is performed by heating ceramic and copper bodies in contact in an atmosphere which will oxidize chromium but which will not oxidize copper at a temperature below the melting point of copper with a copper-chromium alloy sandwiched between the two bodies.

The above processes produce inexpensive, stoutly bonded and hermetically sealed articles of ceramic and copper bodies. These processes are especially applicable to hermetic envelopes such as vacuum envelopes or packages for semiconductor parts, parts of hermetic envelopes, and terminal devices.

Still another object of the present invention is to provide a process for bonding a body of a copper-chromium alloy to ceramics which is as advantageous as the above processes. The process is performed by heating ceramic and copper-chromium alloy bodies in contact in an atmosphere which will oxidize chromium but not oxidize copper at a temperature below the melting point of the copper-chromium alloy.

This process requires one less step than the other processes above. The process also produces articles of bonded ceramic and copper-chromium alloy bodies as advantageous as the articles of the bonded ceramic and copper bodies.

Other objects and advantages of the present invention will be apparent from the following description, claims and attached drawings.

DESCRIPTION OF THE PREFERRED EMBODIMENTS

Figure 1:
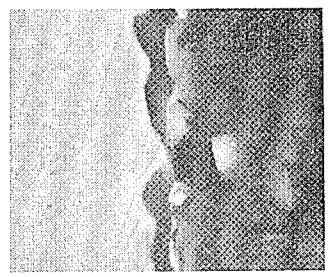
FIG. 1 is a photomicrograph taken by an X-ray microanalyzer of secondary electron emissions from the surface of a section through a bonded portion of an article of bonded alumina ceramic and copper bodies according to the first or second embodiment of the bonding process of the present invention, in which photomicrograph the dark part in the right side represents alumina ceramics, the somewhat lighter part in the left side, copper, and the waved part at the center, chromium oxide.
Figure 2:
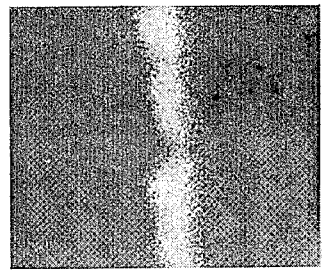
FIG. 2 is a photomicrograph taken by the same X-ray microanalyzer of the characteristic X-ray emissions of chromium from the surface of the section through the bonded portion of the article of the bonded alumina ceramic and copper bodies, in which photomicrograph the light part at the center represents chromium.
Figure 3:
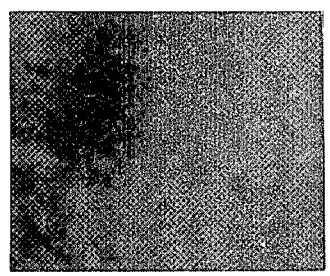
FIG. 3 is a photomicrograph taken by the X-ray microanalyzer of the characteristic X-ray emissions of oxygen from the surface of the section through the bonded portion of the article of the bonded alumina ceramic and copper bodies, in which photomicrograph the group of dispersed light points in the right side represents oxygen.
Figure 4:
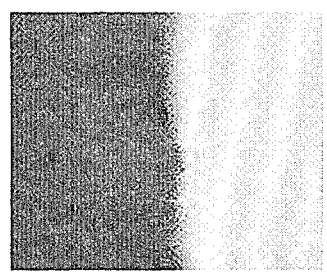
FIG. 4 is a photomicrograph taken by the X-ray microanalyzer of the characteristic X-ray emissions of aluminum from the surface of the section through the bonded portion of the article of the bonded alumina ceramic and copper bodies, in which photomicrograph the light part in the right side represents aluminium.
Figure 5:
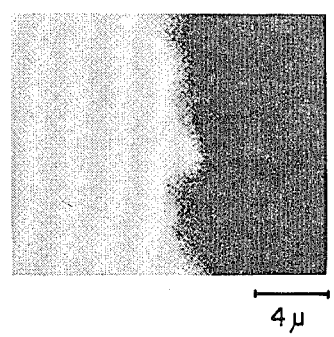
FIG. 5 is a photomicrograph taken by the X-ray microanalyzer of the characteristic X-ray emissions of copper from the surface of the section through the bonded portion of the article of the bonded alumina ceramic and copper bodies, in which photomicrograph the light part in the left side represents copper.

Referring to the attached drawing, the preferred embodiments of the process for bonding a body of copper or of a copper-chromium alloy to a body of ceramics, and the preferred embodiments of articles of a body of ceramics and a body of copper or a copper-chromium alloy bonded by the process will be described in detail.

In accordance with the first embodiment of the bonding process of the present invention, bonding a copper body to ceramics is performed by means of the following process.

First, film of chromium about 1 $\mu$m thick is formed by continuous vacuum deposition on the surface of the alumina ceramic body to be bonded. Second, the chromium film is continuously heated in an atmosphere of air at between $10^{-3}$ and $10^{-4}$ Torr at about 500° C. for 10 minutes to be converted into a chromium oxide film in which chromium (III) oxide predominantes. Third, a temporary assembly of the alumina ceramic and copper bodies attached to each other via the chromium oxide film is continuously heated in an inert atmosphere of between $10^{-4}$ and $10^{-5}$ Torr at 1000° C. for 25 minutes so as not to oxidize the surface of the copper body. Following the heating step, the bonded assembly is slowly cooled within a vacuum furnace to neutralize the thermal stresses generated at the interface between the alumina ceramic and the copper body via plastic deformation of the copper body.

The bonded portion of the article of the alumina ceramic and the copper body produced by the above process was analyzed by the X-ray microanalyzer, resulting in the photomicrographs of FIGS. 1 to 5. All of the FIGS. 1-5 are reproduced at the same enlarged scale. Therefore, it can be seen by superimposing the Figures that chromium has permeated both the alumina ceramic and copper bodies from the bonding boundary between the alumina ceramic body on the right and the copper body on the left.

According to the first embodiment of the bonding process, experiments established that the bond strength between the alumina ceramic and a copper material was no less than 5 kg/mm$^2$.

Moreover, the first embodiment of the bonding process according to the present invention may be performed as follows:

First, a chromium film of no less than 10 nm thickness is formed by vacuum deposition on any ceramic body to be bonded, such as alumina ceramics, mullite ceramics zirconia ceramics or steatite ceramics. Second, the chromium film is continuously heated in an atmosphere of air at no less than $10^{-5}$ Torr at no less than 100° C. for no less than 10 minutes so as to be converted into a chromium oxide in which chromium (III) oxide predominates. Third, a temporary assembly of the ceramic and copper bodies attached to each other by means of the chromium oxide film is continuously heated in an inert atmosphere of no more than $10^{-4}$ Torr, such as within a vacuum furnace, or in helium gas or hydrogen gas, at a temperature between 900° C. and the melting point of copper for no less than 10 minutes so that the surface of the copper body will not be oxidized. Following the heating step, the bonded assembly is slowly cooled under vacuum, helium gas or hydrogen gas, thus producing an aricle of the ceramic and copper bodies stoutly and hermetically bonded together.

In the first embodiment of the bonding process, experiments established that in cases where the chromium film was formed by plating, the film must be no less than 0.1 $\mu$m thick in order to produce the same bond strength as with the above chromium film produced by vacuum deposition.

Moreover, in the first embodiment of the bonding process, experiments established that in cases where the chromium film was formed by applying a paste preparation of 100-mesh or finer chromium powder and a suitable binder, the film must be no less than 0.1 $\mu$m thick in order to produce the same bond strength as with the chromium film produced by vacuum deposition.

Moreover, in the first embodiment of the bonding process, experiments established that the oxidizing treatment of the chromium film required the following conditions: an air pressure of no less than $10^{-5}$ Torr, a temperature of no less than 100° C. and a heating time of no less than 10 minutes, in cases of a 10-nm-thick chromium film due to vacuum deposition, a 0.1-$\mu$m-thick film due to plating, or a 0.1-$\mu$m-thick film due to application of a chromium paste. The reason these conditions can be so moderate seems to be that the extremely strong chemical affinity between chromium and oxygen readily converts chromium into chromium oxide even with very little free oxygen gas present.

Figure 6:
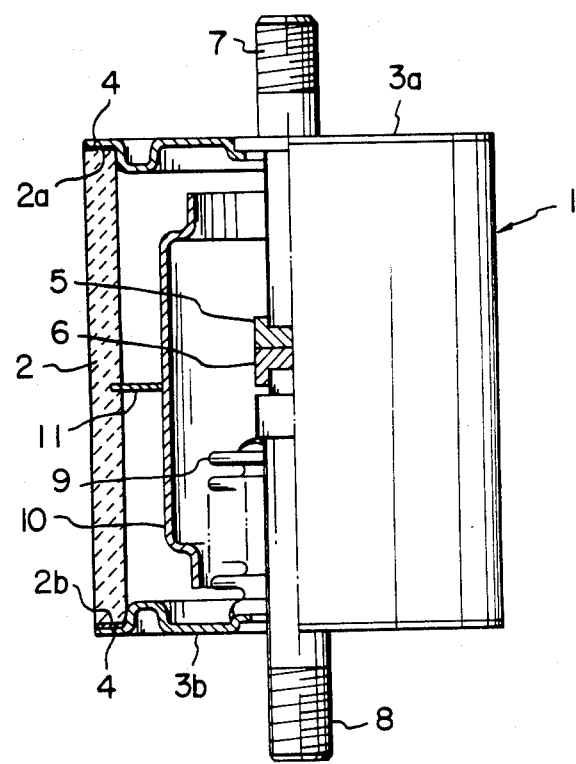
FIG. 6 is a partial longitudinal section of a vacuum interrupter, a vacuum envelope of which includes a bond between an insulating ceramic cylinder and a copper body according to the first to third embodiments of a bonding process of the present invention.

FIG. 6 shows a vacuum interrupter including a vacuum envelope 1 which is constructed in a vacuum-tight manner by means of the first embodiment of the bonding process.

The vacuum envelope 1 comprises in general an insulating cylinder 2 of insulating ceramics such as alumina ceramics, mullite ceramics, zirconia ceramics or steatite ceramics, and disc-shaped copper end plates 3a and 3b, each of which is to be hermetically bonded to one of the end surfaces 2a or 2b of the insulating cylinder 2 via a chromium oxide film 4.

The structural elements of the vacuum interrupter other than the above bonded portion between the insulating cylinder 2 and the copper end plates 3a and 3b will be described below. Located in the vacuum envelope 1 is a set of separable stationary and movable contacts 5 and 6. A stationary lead rod 7 connected to the stationary contact 5 extends out of the vacuum envelope 1 via an aperture at the center of the copper end plate 3a. A movable lead rod 8 connected to the movable contact 6 extends out of the vacuum envelope 1 via an aperture at the center of the copper end plate 3b. The stationary lead rod 7 and the copper end plate 3a are sealed together in a vacuum-tight manner by brazing. The movable lead rod 8 and the copper end plate 3b are sealed together in a vacuum-tight manner by means of metal bellows 9, e.g., of austenitic stainless steel brazed to both the members.

Located between the pair of the stationary and movable contacts 5 and 6 and the insulating cylinder 2 is a generally cylindrical metal shield 10 which is supported at the center of its outer periphery by a metal flange 11 which is secured to the inner periphery of the insulating cylinder 2.

The interior of the vacuum envelope 1 is highly evacuated to no more than $10^{-4}$ Torr.

The vacuum interrupter is manufactured through the following process. First, a chromium film is formed by vacuum deposition to a thickness of no less than 10 nm, by plating or application of chromium paste to a thickness of no less than 0.1 μm on both end surfaces 2a and 2b of the insulating cylinder 2. Second, the chromium film is continuously heated in an atmosphere of air at no less than $10^{-5}$ Torr at a temperature of no less than 100° C. but below the softening point of alumina ceramics so as to be converted into the chromium oxide film 4. Third, the metal shield 10 is fixed to the inner periphery of the insulating cylinder via the metal flange 11. Fourth, the copper end plate 3a, which has the stationary contact 5 and the stationary lead rod 7 built in, is fitted onto the end surface 2a of the insulating cylinder 2 while the copper end plate 3b, which has the movable contact 6, the movable lead rod 8 and the metal bellows 9 built in, is fitted onto the end surface 2b of the insulating cylinder 2. Thus, the temporary assembly step of the vacuum interrupter is completed. Fifth, the temporarily assembled vacuum interrupter is placed under a vacuum of no more than $10^{-4}$ Torr, e.g., in a vacuum furnace. Sixth, the temporarily assembled vacuum interrupter, while the interior of the vacuum envelope 1 remains evacuated to a high vacuum of no more than $10^{-4}$ Torr, is continuously heated at a temperature of no less than 900° C. but less than the melting point of copper for no less than 10 minutes and then slowly cooled under a vacuum of no more than $10^{-4}$ Torr. Thus, vacuum sealing of the vacuum envelope 1 is completed. The resulting vacuum envelope 1 has good airtightness and shock resistance and is relatively inexpensive.

In the fabrication process of the vacuum interrupter, the temporarily assembled vacuum interrupter may be continuously heated under a helium or hydrogen atmosphere at a temperature of no less than 900° C. but less than the melting point of copper, for no less than 10 minutes, and then slowly cooled under the same atmosphere. In this embodiment, any one of the stationary and movable lead rods 7 and 8, and the copper end plates 3a and 3b is provided with evacuating tubes or holes through which the interior of the vacuum envelope 1 can be evacuated.

The second embodiment of the bonding process of the present invention is different from the above first embodiment of the bonding process in that preoxidized chromium is employed as a bonding agent in the second embodiment.

The chromium oxide film is formed on a ceramic body to be bonded by vacuum ion deposition or application of a chromium oxide paste under the same conditions as those of the first embodiment.

The third embodiment of the bonding process of the present invention will be described hereinafter.

First, a 0.1-to-2 mm-thick layer of copper-chromium alloy foil consisting of between about 0.1 and 0.6% chromium by weight in copper (hereinafter, this alloy will be referred to as copper-between 0.1 and 0.6 chromium alloy) is sandwiched between the surfaces of ceramic and copper bodies to be bonded.

Second, a temporary assembly of the ceramic and copper bodies, and the foil of copper-between 0.1 and 0.6 chromium alloy is continuously heated under a vacuum of no more than $10^{-4}$ Torr or under an atmosphere in which chromium will oxidize but copper will not at a temperature of no less than 900° C. but less than the melting point of copper for no less than 10 minutes, and then slowly cooled under the same vacuum or atmosphere. Thus, the third embodiment produces an article of stoutly and hermetically bonded ceramic and copper bodies as in the first embodiment of the bonding process.

In the third embodiment of the bonding process, experiments established that in cases where the amount of chromium added to the copper fell outside the range of between about 0.1 and 0.6 wt. %, the resultant bond strength was insufficient for a vacuum seal.

A vacuum envelope of a vacuum interrupter manufactured by means of the third embodiment of the bonding process is obtainable by employing a foil of copper-between 0.1 and 0.6 chromium alloy in a vacuum envelope 1 as shown in FIG. 6 instead of the chromium oxide film 4. Accordingly, the process for manufacturing the vacuum envelope of a vacuum interrupter in accordance with the third embodiment of the bonding process is more advantageous than the manufacturing processes for the vacuum envelope of a vacuum interrupter in accordance with both the first and second embodiments of the bonding process, in terms both of the number of required steps and of process execution time.

The bonding of copper-between 0.1 and 0.6 chromium alloy to a ceramic body according to the fourth embodiment of the bonding process of the present invention will be described hereinafter.

A temporary assembly of the ceramics, and the copper-between 0.1 and 0.6 chromium in which, the surfaces to be bonded overlap, is continuously heated under a vacuum of no more than $10^{-4}$ Torr or under an atmosphere in which chromium will oxidize but copper will not, at a temperature of no less than 900° C. but less than the melting point of the copper-between 0.1 and 0.6 chromium alloy for no less than 10 minutes, and then slowly cooled under the same vacuum or atmosphere. Thus, the fourth embodiment of the bonding process produces a stoutly and hermetically bonded article made of the bonded ceramic and copper-chromium alloy bodies, as in the first and second embodiments of the bonding process.

Figure 7:
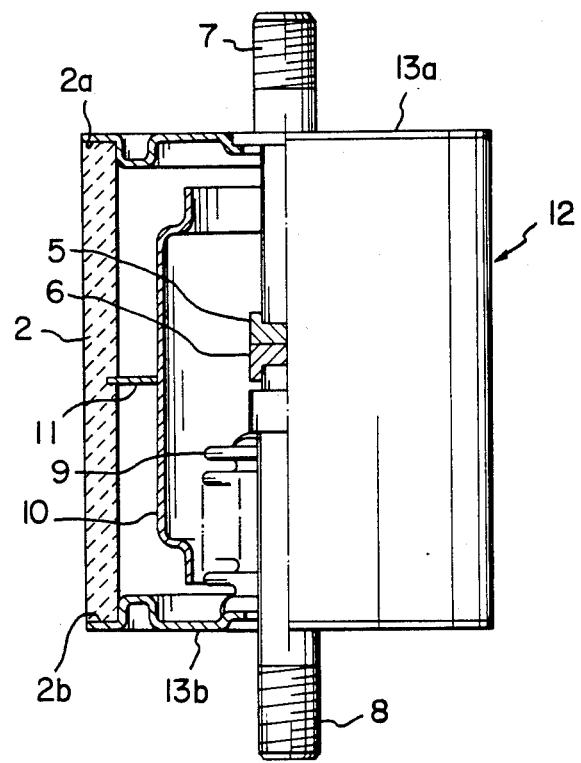
FIG. 7 is a partial longitudinal section of a vacuum interrupter, a vacuum envelope of which includes a bond between an insulating ceramic cylinder and a body of a copper-chromium alloy according to the fourth embodiment of the bonding process of the present invention.

FIG. 7 shows a vacuum interrupter including a vacuum envelope 12 manufactured by means of the fourth embodiment of the bonding process.

The vacuum interrupter of FIG. 7 differs from the vacuum interrupter of FIG. 6 in two points: first, that the end plates 13a and 13b in FIG. 7 are made of the copper-between 0.1 and 0.6 chromium alloy and second, that there is no chromium oxide film on the end surfaces 2a and 2b of the insulating cylinder 2. Accordingly, the process for manufacturing the vacuum envelope of a vacuum interrupter in accordance with the fourth embodiment of the bonding process is more advantageous than the manufacturing process of the vacuum envelope of a vacuum interrupter in accordance with the third embodiment of the bonding process, in terms of the number of steps required and execution time.

The bonding processes of the present invention are applicable to vacuum envelopes of vacuum interrupters of any of the following structures:

(1) a cylinder of copper or copper-between 0.1 and 0.6 chromium alloy, and end plates of insulating ceramics for sealing in a vacuum-tight manner both the end openings of the cylinder;

(2) a bottomed cylinder, in particular, a cup of copper or copper-between 0.1 and 0.6 chromium alloy, and an end plate of insulated ceramics for sealing in a vacuum-tight manner the end opening of the bottomed cylinder;

(3) no less than two insulating cylinders of insulating ceramics that are connected end-to-end by means of short, circular-ring-shaped metal sealing fittings of copper or copper-between 0.1 and 0.6 chromium alloy; and (4) a single insulating cylinder constructed by hermetically connecting an insulating cylinder of insulating ceramics and a cylinder of copper or copper-between 0.1 and 0.6 chromium alloy end-to-end, and end plates or caps in the form of bottomed cylinders of copper or copper-between 0.1 and 0.6 chromium alloy for sealing in a vacuum-tight manner both the end openings of the single insulating cylinder.

The bonding process of the present invention can be used to produce various kinds of hermetic envelopes which will all exhibit good airtightness and shock resistance.

It is apparent to the man of ordinary skill in the art that the present invention may be modified in many ways without deviating from the scope of invention as defined in the attached claims.

What is claimed is:

1. A process for bonding a copper body and a ceramic body to each other, said ceramic body having a melting point higher than that of copper, said process comprising the steps of:
   directly sandwiching a layer of chromium oxide between the copper and ceramic bodies;
   heating a temporary assembly of the ceramic and copper bodies and the chromium oxide in an atmosphere in which copper will not oxidize, at a temperature of at least 900° C. but below the melting point of copper; and then
   slowly cooling the resulting bonded assembly in which a bonded portion of the copper body is plastically deformed.

2. A process as defined in claim 1, wherein said chromium oxide sandwiching step includes the steps of forming a chromium film at least 10 nm thick on a surface of the ceramic body, and oxidizing the chromium film.

3. A process as defined in claim 2, wherein said chromium film oxidizing step is performed by continuously heating the chromium film in an atmosphere of air at a pressure of at least $10^{-5}$ Torr and at a temperature of at least 100° C. for at least 10 minutes.

4. A process as defined in claim 1, wherein the atmosphere in the temporary assembly heating step is a vacuum of at least $10^{-4}$ Torr and heating is maintained in such atmosphere for at least 10 minutes.

5. A process as defined in claim 1, wherein the atmosphere in the temporary assembly heating step is of a non-oxidizing gas and heating is maintained in such atmosphere for at least 10 minutes.

6. A process as defined in claim 1, wherein said chromium oxide sandwiching step includes the step of forming a chromium oxide film at least 10 nm thick on the ceramic body by vacuum ion deposition.

7. A process for bonding a copper body and a ceramic body to each other, said ceramic body having a melting point higher than that of copper, said process comprising the steps of:
   directly sandwiching a layer of a copper-chromium alloy consisting essentially of copper and about 0.1 to 0.6 weight percent chromium between the ceramic and copper bodies;
   heating a temporary assembly of the ceramic and copper bodies and the copper-chromium alloy in an atmosphere in which chromium will oxidize but copper will not oxidize, at a temperature of at least 900° C. but below the melting point of copper; and then
   slowly cooling the resulting bonded assembly in which a bonded portion of the copper body is plastically deformed.

8. A process as defined in claim 7, wherein the copper-chromium alloy layer is a foil.

9. A process as defined in claim 7, wherein the atmosphere in the temporary assembly heating step is a vacuum of at least $10^{-4}$ Torr and heating is maintained in such atmosphere for at least 10 minutes.

10. A process as defined in claim 7, wherein the atmosphere in the temporary assembly heating step is of a non-oxidizing gas and heating is maintained in such atmosphere for at least 10 minutes.

11. A process for bonding a body of a copper-based alloy consisting essentially of copper and about 0.1 to 0.6 weight percent chromium and a ceramic body to each other, said ceramic body having a melting point higher than that of copper, said process comprising the steps of:
   directly contacting the copper-based alloy body to the ceramic body;
   heating a temporary assembly of the copper-based alloy body and the ceramic body in an atmosphere in which chromium will oxidize but copper will not oxidize, at a temperature of at least 900° C. but below the melting point of the copper-based alloy; and then
   slowly cooling the resulting bonded assembly in which a bonded portion of the copper-based alloy body is plastically deformed.

12. A process as defined in claim 11, wherein the atmosphere in the temporary assembly heating step is a vacuum of at least $10^{-4}$ Torr and heating is maintained in such atmosphere for at least 10 minutes.

13. A process as defined in claim 11, wherein the atmosphere in the temporary assembly heating step is of a non-oxidizing gas and heating is maintained in such atmosphere for at least 10 minutes.

* * * * *